(12) United States Patent
Taylor

(10) Patent No.: US 7,872,265 B2
(45) Date of Patent: Jan. 18, 2011

(54) ELECTRICAL SWITCHING DEVICE AND METHOD OF EMBEDDING CATALYTIC MATERIAL IN A DIAMOND SUBSTRATE

(75) Inventor: Gareth Andrew Taylor, Newcastle Upon Tyne (GB)

(73) Assignee: Evince Technology Limited, Newcastle Upon Tyne (GB)

( * ) Notice: Subject to any disclaimer, the term of this patent is extended or adjusted under 35 U.S.C. 154(b) by 0 days.

(21) Appl. No.: 12/835,669

(22) Filed: Jul. 13, 2010

(65) Prior Publication Data

US 2010/0308342 A1 Dec. 9, 2010

Related U.S. Application Data

(62) Division of application No. 12/302,462, filed on Nov. 25, 2008, now Pat. No. 7,781,257.

(30) Foreign Application Priority Data

Jun. 13, 2006 (GB) .................................. 0611594.3
May 16, 2007 (WO) ............... PCT/GB2007/001808

(51) Int. Cl.
*H01L 31/0312* (2006.01)
*H01L 21/00* (2006.01)
(52) U.S. Cl. ........................................ 257/77; 438/105

(58) Field of Classification Search ................. 438/105, 438/931; 257/77, E29.068, E29.246
See application file for complete search history.

(56) References Cited

U.S. PATENT DOCUMENTS

| 5,506,422 | A | 4/1996 | Dreifus et al. ................ 257/77 |
| 6,501,145 | B1 | 12/2002 | Kaminski et al. ............ 257/471 |
| 6,693,024 | B2 * | 2/2004 | Lehmann et al. ............ 438/542 |
| 7,781,257 | B2 * | 8/2010 | Taylor ........................ 438/105 |
| 2002/0197832 | A1 | 12/2002 | Lehmann et al. ............ 438/542 |

FOREIGN PATENT DOCUMENTS

| EP | 0 971 418 A2 | 1/2000 |
| EP | 1 211 732 A1 | 6/2002 |
| WO | 2005/057660 A1 | 6/2005 |
| WO | 2007/144560 A1 | 12/2007 |

OTHER PUBLICATIONS

Michael W. Geis, "Diamond Transistor Performance and Fabrication," Proceedings of the IEEE, No. 5, May 1991, New York.*

(Continued)

*Primary Examiner*—Calvin Lee
(74) *Attorney, Agent, or Firm*—Zilka-Kotab, PC

(57) ABSTRACT

An electrical device according to one embodiment includes a substrate including at least one diamond layer; at least one first electrode in contact with said substrate, wherein at least one said first electrode includes at least one electrically conductive protrusion extending into said substrate; and at least one second electrode in contact with said substrate and spaced from the or each said first electrode.

10 Claims, 4 Drawing Sheets

OTHER PUBLICATIONS

International Search Report from PCT Application No. PCT/GB2007/001808 mailed on Oct. 26, 2007.

Kobashi et al., "Formation of fibrous structures on diamond by hydrogen plasma treatment under DC bias" © 2001 Elsevier Science B.V., Diamond and Related Materials, Elsevier Science Publishers, Amsterdam, NL. vol. 10, No. 11, Nov. 2001, p. 2039-2043 www.elsevier.com/local.

Geis et al., Electrical, crystallographic, and optical properties of ArF laser modified diamond surfaces © 1989 American Institute of Physics, Applied Physics Letter, Nov. 27, 1989, vol. 55, No. 22, p. 2295-2297.

Geis, Michael W. "Diamond Transistor Performance and Fabrication" © 1991 IEEE, Proceedings of the IEEE, New York, US, vol. 79, No. 5, May 1, 1991, p, 669-675.

Office Action Summary from U.S. Appl. No. 12/302,462 mailed on Feb. 19, 2010.

Notice of Allowance from U.S. Appl. No. 12/302,462 mailed on May 7, 2010.

\* cited by examiner

ELECTRICAL SWITCHING DEVICE AND METHOD OF EMBEDDING CATALYTIC MATERIAL IN A DIAMOND SUBSTRATE

The present application is a divisional of U.S. patent application Ser. No. 12/302,462, filed Nov. 25, 2008 now U.S. Pat. No. 7,781,257, and claims the priority of a United Kingdom patent application filed Jun. 13, 2006 under application number 0611594.3, all of which are incorporated herein by reference.

The present invention relates to electrical switching and amplification devices, and relates particularly, but not exclusively, to electrical switching devices for use in high power applications. The invention also relates to a method of embedding catalytic material in a diamond substrate.

As is well known by persons skilled in the art, silicon has limitations when used as a base electronic material for switching and amplification applications in high power and extreme environments. For example, silicon is known to have a reverse breakdown voltage of about 8 kV, based on acceptable levels of on-state losses and usable switching speed. This means that to achieve significant voltage and/or current levels in several end use applications requires employing a plurality of discrete devices in series or parallel combinations, which in turn requires other electronic components to ensure that the duty between devices remains balanced and hence can be complex to undertake.

Diamond offers potential solutions to this problem because of its thermal, dielectric and carrier mobility properties which are generally significantly better than any other electronic material. Devices made from diamond hence offer the potential to significantly reduce complexity by reducing the number of discrete devices needed to fulfil the application.

In most semiconductor devices, electronic function is achieved by modifying the electronic properties of the base material through the selectively introduction of foreign elements into the crystalline structure otherwise known as dopants. In the case of diamond the choice of dopants is limited by the comparatively small size of the crystal lattice. The result is that the two dopants that create the least disturbance to the diamond crystal structure are boron (p-type) and nitrogen (n-type). While boron doped diamond is a reasonably effective p-type semiconductor, no effective n-type dopant has yet been found. The problem is that both dopant species are deep donors with activation energies of 0.7 eV and 4.5 eV respectively leading to the requirement for heating to assist the release of charge carriers in order to realise effective device operation.

However the process of heating also leads to a reduction in carrier mobility values and electric field breakdown strength thus compromising two of the key properties that make diamond ideal for the fabrication of high power switches. As such devices fabricated in this way do not exploit the inherent physical properties of diamond as an electronic material.

Existing devices always trade-off the voltage that they can block in the off-state with the current that they can pass in the on-state. Further to achieve the highest voltage and power ratings in non-diamond materials usually requires a bipolar structure for the device. As the junction size is physically increased to increase the switching voltage of the device the amount of charge that has to neutralised to turn the device off also increases, which in turn compromises the switching frequency of the device.

Preferred embodiments of the present invention seek to overcome the above disadvantages of the prior art by using a unipolar structure that enables the full material potential of diamond to be exploited for power devices. The present invention exploits a number of known phenomena relating to diamond. Namely that: ballistic electrons can travel through a few hundred micrometers of intrinsic diamond with very little loss; doped diamond can be used to control space charge build-up from a mono-species plasma; and, electrons can be emitted into diamond directly from a sharp conductive intrusion embedded within a diamond substrate. The invention therefore seeks to employ an engineered electron emitter structure embedded within diamond that in turn will only conduct in the present of a suitable direct current bias and to use the electron transport properties of diamond to enable conduction through the material.

According to an aspect of the present invention, there is provided an electrical device comprising:

a substrate including at least one diamond layer;

at least one first electrode in contact with said substrate, wherein at least one said first electrode includes at least one electrically conductive protrusion extending into said substrate; and at least one second electrode in contact with said substrate and spaced from the or each said first electrode.

This provides the advantage that by suitable construction of the electrically conductive protrusions, field-enhanced electron emission can occur within the diamond material. This in turn enables the device to operate at lower temperatures than conventional electrical devices containing diamond, and to have favourable on-state conductivity and off-state current blocking properties.

The substrate may comprise, adjacent at least a distal end of at least one said protrusion, diamond material including first impurities adapted to modify the electrical characteristics of said diamond material adjacent said distal end.

This provides the advantage of reducing the potential barrier between the electrically conductive protrusions and the diamond layer, which in turn reduces the potential required to activate the device.

The first impurities may be adapted to provide said material with n-type electrical characteristics.

This provides the advantage of introducing free electrons which enhance the conductivity of the device in its on-state.

The substrate may comprise, adjacent at least one said second electrode, diamond material including second impurities adapted to modify the electrical characteristics of said diamond material adjacent said second electrode.

This provides the advantage of enabling the incidence of space charge build-up within the substrate material to be reduced, which would otherwise restrict the magnitude of the on-state current of the device.

The second impurities may be adapted to provide said diamond material with p-type electrical characteristics.

The device may further comprise at least one third electrode arranged in said substrate and spaced from the or each said first electrode and the or each said second electrode.

This provides the advantage of enabling the electric field in the vicinity of the protrusions, and therefore the current flow in the on-state, to be controlled by applying a suitable voltage bias to the third electrode.

At least one said third electrode may define at least one respective aperture adjacent at least one said protrusion.

This provides the advantage of enabling further control of the electric field in the vicinity of the protrusions.

At least one said third electrode may be arranged in a layer of intrinsic diamond material.

This provides the advantage of reducing the leakage current from the third electrode to the first or second electrodes, which in turn improves performance of the device.

At least one said third electrode may include non-diamond carbon formed through the transformation of selective areas of the diamond material using an implantation technique.

This provides the advantage of simplifying manufacture of the device, by minimising the requirement for buried metallic layers.

At least one said third electrode may include diamond material containing impurities adapted to increase the electrical conductivity of said material.

This provides the advantage of avoiding having to graphitise diamond by exploiting the high mobility properties of semiconductor diamond and may be homoepitaxially grown rather than implanted.

The device may further comprise a plurality of separated said second electrodes.

This provides the advantage of enabling devices to be constructed in which current flow between a plurality of second electrodes can be controlled by the application of a suitably biased voltage signal to the third electrode, as a result of which amplification can be achieved.

According to another aspect of the present invention, there is provided a method of modifying a substrate including at least one layer of diamond material, the method comprising:

depositing at least one catalytic material on at least predetermined regions of diamond material of said substrate;

causing at least part of said diamond material in contact with at least part of said catalytic material to be converted into non-diamond carbon; and causing at least part of said catalytic material to penetrate said substrate.

This provides the advantage of enabling long holes of small diameter to be created in the substrate. This in turn enables electrical devices to be manufactured having electrically conductive protrusions with high aspect ratio, which in turn enables devices of high performance to be manufactured.

The method may further comprise causing said catalytic material on said predetermined regions of said diamond material to form separated regions of catalytic material.

This provides the advantage of enabling the catalytic material to be patterned on the substrate in a highly localised manner.

The step of causing at least one said catalytic material to form a plurality of separated regions may comprise heating said material in the presence of at least one plasma discharge containing at least one reducing component.

At least part of said diamond material in contact with at least part of said catalytic material may be caused to be converted into non-diamond carbon by means of heating.

The method may further comprise modifying at least part of a surface of said substrate prior to depositing said catalytic material thereon to reduce reactivity of said catalytic material with said substrate.

This provides the advantage of enabling reaction of the catalytic material with the diamond substrate to be controlled, which in turn improves the manufacturing process.

The method may further comprise forming at least one region of non-diamond carbon damage to diamond material on a surface of said substrate.

This provides the advantage of aiding localisation of the reaction of the catalytic material with the substrate, which in turn improves the accuracy of the manufacturing process.

At least one said catalytic material may be patterned by means of a lithographic process.

At least part of said catalytic material may be caused to penetrate said substrate by means of heating the substrate to a sufficient temperature to initiate catalytic decomposition of the diamond to non-diamond and applying a suitable uniformly biased magnetic and/or electric field.

This provides the advantage of ensuring catalytic action and imparting directional movement to the catalytic material through the interaction of the catalytic material and the external electric and or magnetic field.

At least part of said catalytic material may be caused to penetrate the substrate by means of at least one plasma discharge.

This provides the advantage of imparting electrical charge to the catalytic material to ensure that interaction with the external electric and or magnetic field will direct the catalytic material to penetrate into the substrate by applying a suitable dc bias to the plasma discharge.

The method may further comprise removing non-diamond carbon by means of at least one plasma discharge by utilising gaseous species that are known to preferentially react with non-diamond carbon that may be optionally used as the base plasma to impart charge to the catalytic material.

This has the advantage of reducing the number of manufacturing steps.

The method may further comprise modulating at least one said plasma discharge using an alternating current source such as a radio or microwave frequency supply.

This provides the advantage of reducing ion impact damage to the diamond material but will enhance the reactive removal of non-diamond carbon.

According to a further aspect of the present invention, there is provided a method of manufacturing an electrical device, the method, comprising:

forming at least one hole in a substrate by means of a method as defined above;

forming at least one first electrode in contact with said substrate; and forming at least one second electrode in contact with said substrate and spaced from the or each said first electrode.

Preferred embodiments of the invention will now be described, by way of example only and not in any limitative sense, with reference to the accompanying drawings, in which:—

Figure 1A:
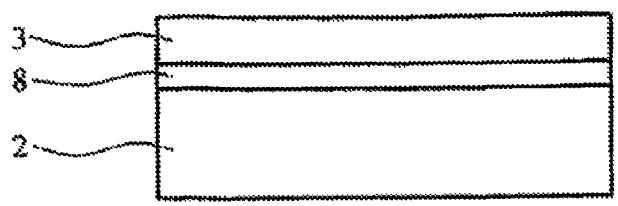
FIGS. 1A to 1I show steps of a manufacturing method embodying the present invention.
Figure 1B:
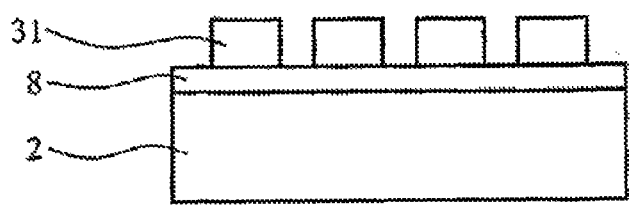

Referring to FIG. 1A, a diamond substrate 2 is polished to a high degree of flatness and may be treated using techniques familiar to those skilled in the art to form an oxygenated, hydrogenated, halogenated or hydroxyl supporting surface on the substrate 2. This process may involve a high frequency glow discharge (not shown). A catalytic metal 8 such as iron, cobalt, nickel or platinum is then deposited as a uniform layer on the treated surface of the substrate 2 by means of an evaporation or sputtering process to a thickness of 2 to 50 nm, and a mask 3 of suitable material is then deposited on the catalytic metal 8. Referring to FIG. 1B the mask 3 may be selectively removed using a lithographic process to leave in the desired pattern 31 and expose the remaining areas of catalytic metal 8.

Figure 1C:
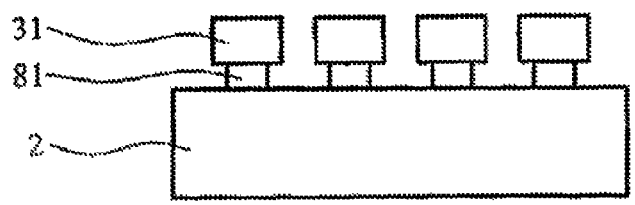

The catalytic metal 8 not covered by the mask 3 is then removed by means of a chemical etching process to provide separated regions 81 of catalytic metal as shown in FIG. 1C.

Alternatively the steps shown in FIGS. 1A through 1C may be reversed such the mask 3 is deposited directly on the substrate 2 and lithographically processed to achieve the desire pattern 31 prior to deposition of the catalytic metal 8 to achieve the separated regions 81.

Figure 1D:
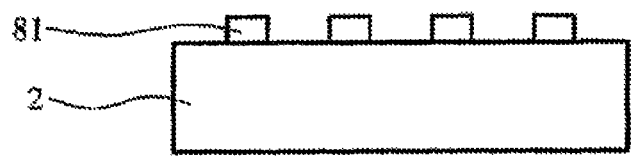
Figure 1E:
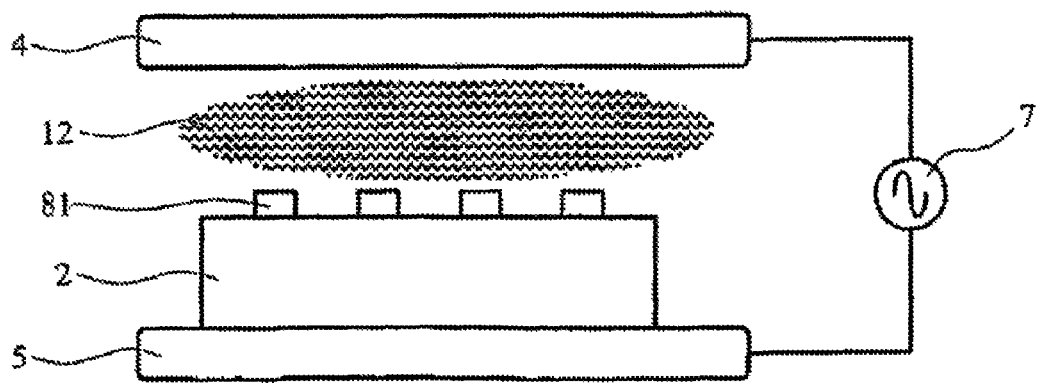
Figure 1F:
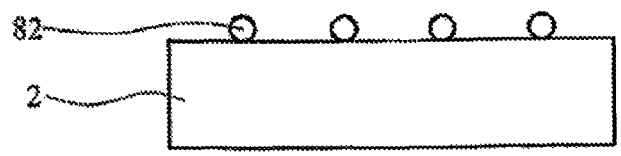

The remaining mask 31 is then removed as shown in FIG. 1D, and coated substrate 2 is annealed at 500° C. or higher in a vacuum environment or in the presence of an ac modulated plasma discharge 12 containing a hydrogen rich gas such as ammonia at a pressure of 1-10 mbar struck between electrodes 4 and 5 as shown in FIG. 1E, which causes the separated regions 81 of catalytic metal to form highly localised globules or spheroids 82 as shown in FIG. 1F.

Figure 1G:
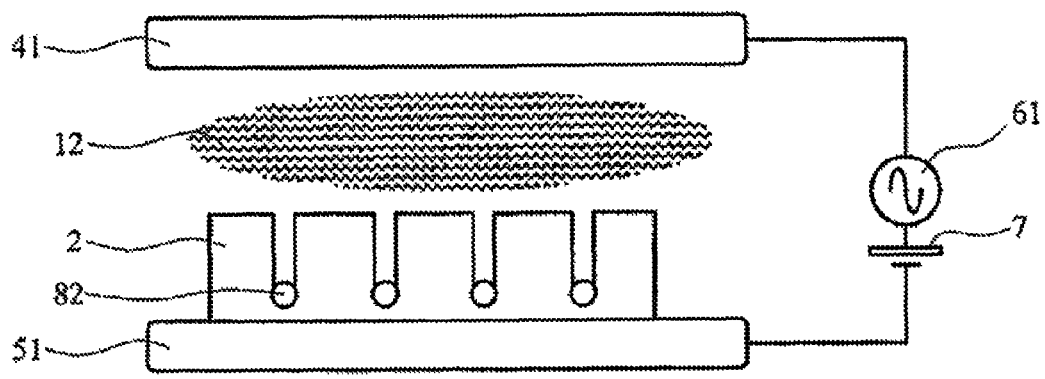

Referring to FIG. 1G, on completion of the annealing process, the substrate 2 is heated to a temperature of 600° C. or more and simultaneously a uniform electric field with a bias voltage of 400V or more is applied by means of a DC power supply 7 applied to electrode 41 such that it is positively biased relative to an electrode 51 located on the opposite face of the substrate 2. Under these conditions, the catalytic particles 82 cause the diamond of the substrate 2 in contact with the particles 82 to be converted to non-diamond carbon, such as graphite or amorphous carbon.

Figure 1H:
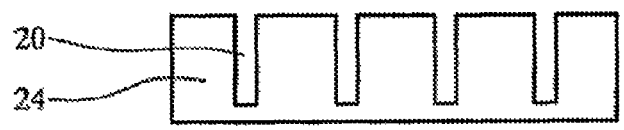

By introducing an atmosphere of a hydrogen rich gas such as ammonia at a pressure of 1-10 mbar a plasma discharge 13 will be struck between electrode 41 and the substrate 2. The plasma discharge 13 causes the catalytic particles 82 to acquire an electrical charge because of their small size, and the bias voltage of DC supply 7 causes the catalytic particles 82 to move in the direction of the field towards the electrode 51, i.e. further into the substrate 2 leaving a trail of non-diamond carbon. By ensuring that the voltage drop across the plasma discharge between electrodes 41 and 51 exceeds 400V the trail of non-diamond carbon (not shown) will be columnar and orientated according to the field direction. The efficacy of this action is further enhanced by the introduction into the discharge 13 of additional gases known to those skilled in the art that will preferentially react with non-diamond carbon and thereby etch the non-diamond carbon generated by the action of the catalytic particles 82 to create small diameter holes 20. A radio frequency power supply 22 may also be introduced to modulate the discharge 13, which further enhances the process of etching the graphite above the catalytic particles 82 to remove the graphite by means of the discharge 13. When holes 20 of the desired depth are created, the substrate 2 is allowed to cool, as a result of which the catalytic action of particles 82 ceases and the modified substrate 24 shown in FIG. 1H is formed.

The modified substrate 24 is then cleaned by means of a suitable acid to remove the catalytic particles 82 from the bases of the holes 20, and is then optionally further treated by means of a compound such as molten sodium nitrate to remove any remaining amorphous or graphitised carbon. A further layer 14 of diamond can then be grown on the non-etched face of the substrate 24 to achieve the desired electrical and or mechanical properties, as shown in FIG. 1I.

Figure 1I:
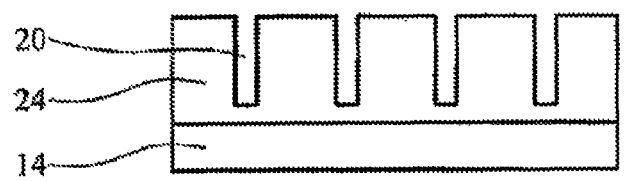
Figure 2:
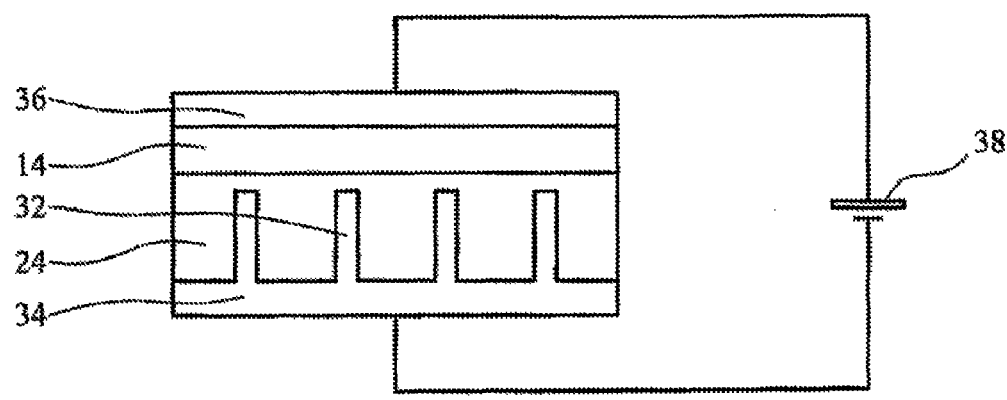
FIG. 2 is a schematic cross-sectional representation of an electrical switching device of a first embodiment of the present invention.

Referring now to FIG. 2, a diode-type electrical switching device 30 is formed using an intrinsic or nitrogen doped diamond substrate 24 as shown in FIG. 1I. The holes 20 in the substrate 24 are filled with a suitable electrically conductive metal to form a metal micro-emitter structure 32 in contact with a main cathode 34. Alternatively, more than one metal may be deposited in steps in the holes 20 in order to make the metal/diamond interface ohmic in nature or to reduce the work function between the metal and diamond, especially in the vicinity of the holes 20. Prior to deposition of these metals the holes 20 and substrate 24 may be pre-treated in an oxygen and or hydrogen high-frequency discharge (not shown) to assist in further reducing the potential barrier between the metal 32 and substrate 24. A further plane electrode 36 is placed on the opposite plane surface of the diamond substrate 24 and is insulated from the ends of the emitters 32 by the layer 14 of intrinsic or low boron doped homoepitaxial diamond or other such dopant so as to introduce electron acceptor sites within the layer 14. When a voltage is applied between the electrodes 34, 36 such that the potential of the upper electrode 36 is greater than that of the lower electrode 34 and such that the voltage is of sufficient magnitude so that the local field at the ends of the emitters 32 is sufficient to cause the emission of electrons into the diamond layers 24 and subsequently 14, electrical conduction between the electrodes 34,36 can occur. If the bias of power supply 38 is reversed, on the other hand, such that the potential of the lower electrode 34 is greater than that of the upper electrode 36, the emission of electrons is significantly reduced, since the curvature of the surface of the plane electron emitting electrode 36 is significantly less than that at the distal ends of the emitters 32.

Figure 3A:
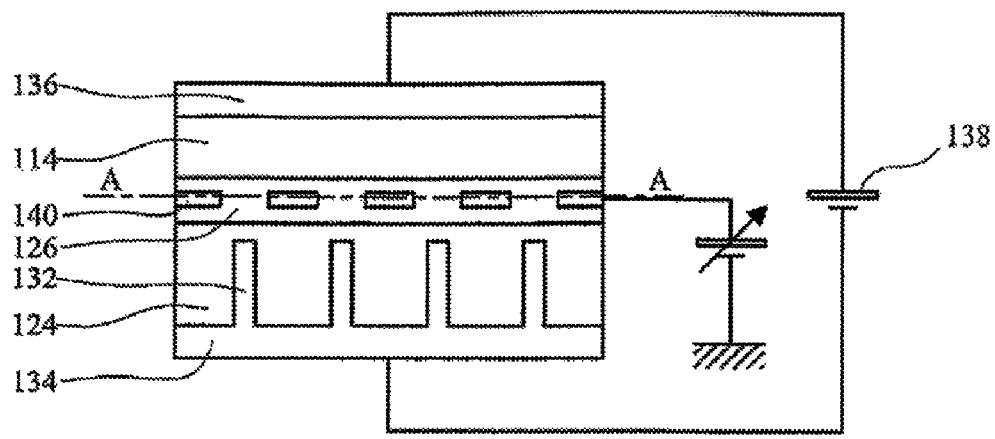
FIG. 3A is a schematic representation, corresponding to FIG. 2, of a device of a second embodiment of the present invention.
Figure 3B:
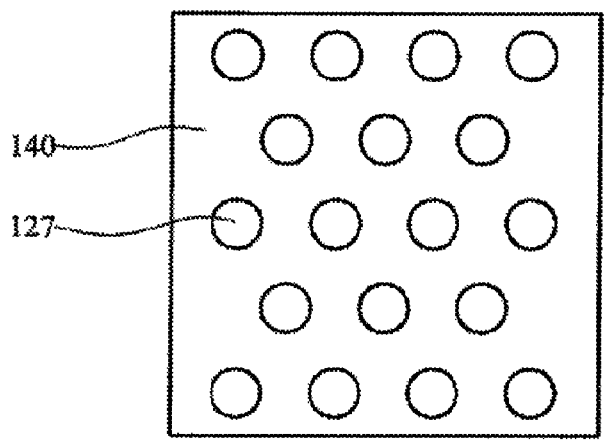
FIG. 3B is a plan view of a control electrode of the device of FIG. 3A.

A device 130 of a second embodiment of the invention is shown in FIG. 3A, in which parts common to the embodiment of FIG. 2 are denoted by like reference numerals but increased by 100. The forward and reverse bias characteristics of the diode device 30 shown in FIG. 2 are primarily determined by the thickness of the insulating layer 14. Since a large voltage drop would occur across the device of FIG. 2 as a result of the size of the field required to sustain electron emission, this would limit the performance of the device as a rectifier. However, the embodiment shown in FIG. 3A alleviates this problem by means of control of injection of electrons into the substrate 124 by means of the electric field established between a gate electrode 140 and the emitters 132. The gate electrode 140 is manufactured by means of first growing at the stage indicated by FIG. 1I an additional intermediate layer of intrinsic diamond 126 on the base substrate 124 to which a masked implantation process is applied such that a subsurface layer of the diamond is treated using a high energy ion beam to create a conductive layer in the diamond prior to growing the additional diamond layer 114. The conductive layer is patterned as shown in FIG. 3B, with apertures 127 centred around the tip of each emitter 132, whose alignment is indicated by a cross in the figure, to produce a generally uniform annular field about the tip of each emitter 132. The current flow between the upper 136 and lower 134 electrodes will be generally proportional to the applied voltage between the gate electrode 140 and the emitters 132.

Figure 4:
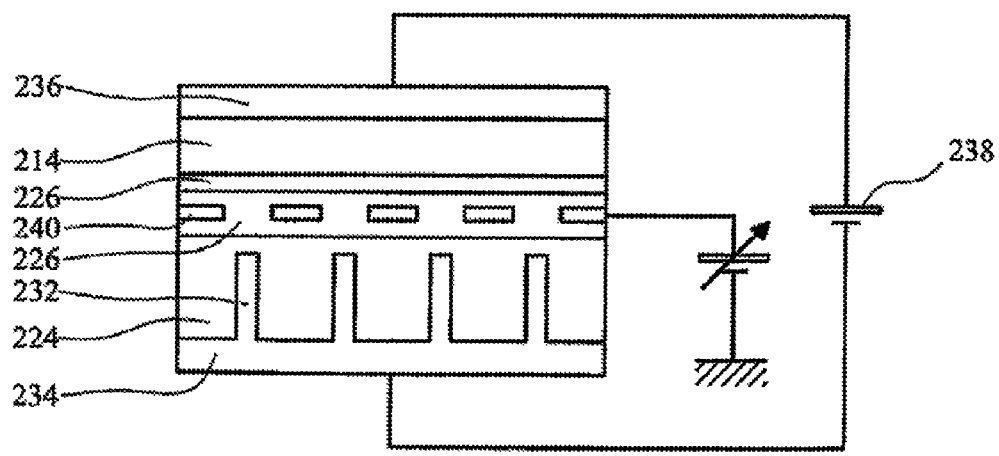
FIG. 4 is a schematic representation, corresponding to FIG. 2, of a device of a third embodiment of the present invention.

A device 230 of a third embodiment of the invention is shown in FIG. 4, in which parts common to the embodiment of FIGS. 3A and 3B are denoted by like reference numerals but increased by 100. At the stage indicated by FIG. 1I a further layer 246 of a heavily nitrogen doped or other n-type doped layer 246 of diamond is grown or implanted on top of the treated diamond layer 226 as described in the third embodiment. A final layer 214 of intrinsic or p-type diamond is then grown on the top of the n-type layer 246. The purpose of the n-type layer 246 is to diffuse electron emission from the point sources formed by the tips of the emitters 232, as a result of which better use is made of the available bulk diamond. The n-type layer 246 also helps screen the emitter tips 232 and gate 240 when the device is reverse biased.

A device 330 of a fourth embodiment of the invention is shown in FIG. 5A, in which parts common to the embodiment of FIG. 4 are denoted by like reference numerals but increased by 100. The upper electrode 236 of FIG. 4 is replaced by two separated metallic electrodes 350, 352 and a further insulating layer 354 is optionally grown or deposited on the substrate 324 to partially or completely cover the electrodes 350, 352 and the space between the electrodes. If a voltage is applied solely between the electrodes 350 and 352, no current results. However, if a separate bias is applied to gate electrode 340 and the emitters 332 such that electrons are emitted into the additional diamond layer 314, conduction between the electrodes 350, 352 becomes possible by virtue of the availability of carriers generated by electrons emitted from the emitters 332. The magnitude of electrical current flow between the electrodes is determined by the number of electrons injected into the diamond layer 314, which is in turn generally proportional to the bias applied between the gate electrode 340 and the lower electrode 334.

Figure 5:
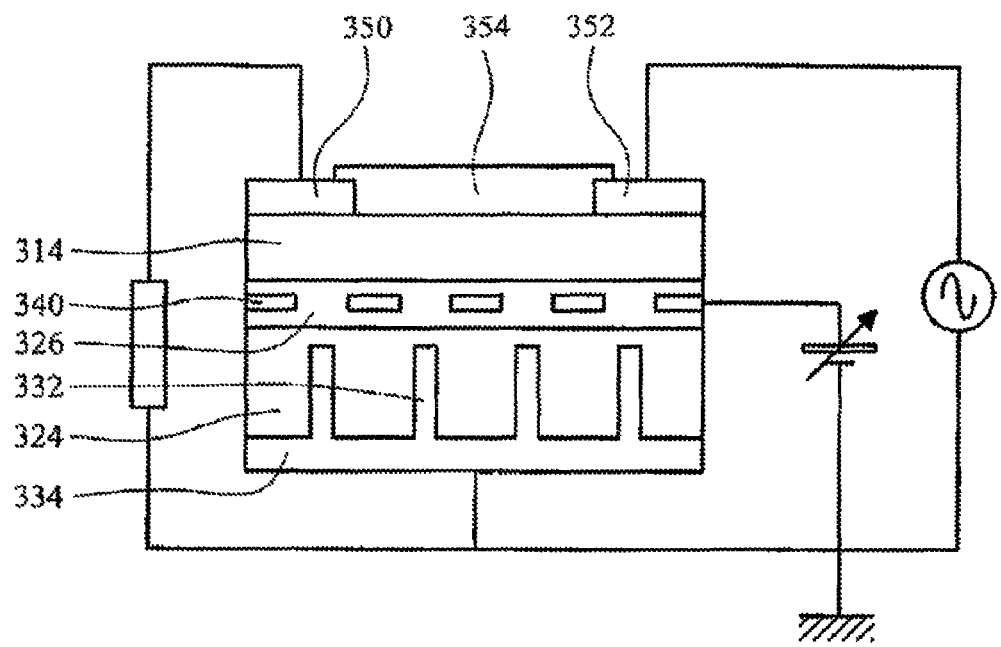
FIG. 5 is a schematic representation, corresponding to FIG. 2, of a device of a fourth embodiment of the present invention.
Figure 6:
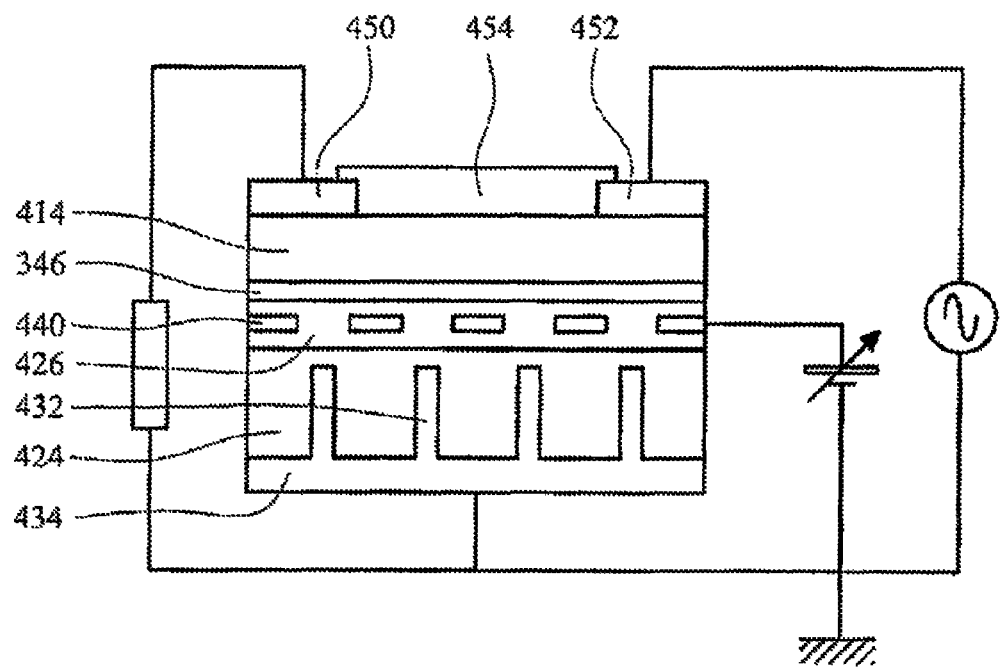
FIG. 6 is a schematic representation, corresponding to FIG. 2, of a device of a fifth embodiment of the present invention that incorporates features of the third and fourth embodiments.

A further embodiment of the invention is shown in FIG. 6, which incorporates features of the third and fourth embodiments to this invention in which parts common to the embodiment of FIGS. 4 and 5 are denoted by like reference numerals but increased by 100. The device 430 includes an n-type layer 346 and p-type layer 414 similar to the arrangement of FIG. 4. The presence of the n-type layer 346 helps to maintain a generally uniform density of electron injection into the diamond layer 414 and deters leakage current to the emitter electrodes 432 and gate electrode 440.

It will be appreciated by persons skilled in the art that the above embodiments has been described by way of example only, and not in any limitative sense, and that various alterations and modifications are possible without departure from the scope of the invention as defined by the appended claims. For example, the substrate 24 of the invention may be used for a purpose other than as the basis for a switching electrical device, for example as a fine mesh filter or optical waveguide.

The invention claimed is:

1. An electrical device comprising:
a substrate including at least one diamond layer;
at least one first electrode in contact with said substrate, wherein at least one said first electrode includes at least one electrically conductive protrusion extending into said substrate; and
at least one second electrode in contact with said substrate and spaced from the or each said first electrode wherein said substrate comprises, adjacent at least a distal end of at least one said protrusion, a diamond material including first impurities adapted to modify the electrical characteristics of said diamond material adjacent said distal end.

2. A device according to claim 1, wherein the first impurities are adapted to provide said material with n-type electrical characteristics.

3. A device according to claim 1, wherein the substrate comprises, adjacent at least one said second electrode, diamond material including second impurities adapted to modify the electrical characteristics of said diamond material adjacent said second electrode.

4. A device according to claim 3, wherein the second impurities are adapted to provide said diamond material with p-type electrical characteristics.

5. A device according to claim 1, further comprising at least one third electrode arranged in said substrate and spaced from the or each said first electrode and the or each said second electrode.

6. A device according to claim 5, wherein at least one said third electrode defines at least one respective aperture adjacent at least one said protrusion.

7. A device according to claim 5, wherein at least one said third electrode is arranged in a layer of intrinsic diamond material.

8. A device according to claim 5, wherein at least one said third electrode includes non-diamond carbon.

9. A device according to claim 5, wherein at least one said third electrode includes diamond material containing impurities adapted to increase the electrical conductivity of said material.

10. A device according to claim 1, further comprising a plurality of separated said second electrodes.

* * * * *